United States Patent
Takahata

[19]
[11] Patent Number: 5,929,797
[45] Date of Patent: Jul. 27, 1999

[54] D/A CONVERTER CONTROL METHOD FOR IC TEST APPARATUS

[75] Inventor: Yukihiro Takahata, Tokyo, Japan

[73] Assignee: Ando Electric Co., Ltd, Tokyo, Japan

[21] Appl. No.: 08/895,197

[22] Filed: Jul. 16, 1997

[30] Foreign Application Priority Data

Jul. 31, 1996 [JP] Japan ................................. 8-217736

[51] Int. Cl.⁶ .................................................. H03M 1/10
[52] U.S. Cl. ........................................... 341/120; 341/144
[58] Field of Search .................................... 341/120, 118, 341/144, 139; 324/74

[56] References Cited

U.S. PATENT DOCUMENTS 4,829,236  5/1989  Brenardi et al. ...................... 324/73 R

*Primary Examiner*—Brian Young
*Attorney, Agent, or Firm*—Darby & Darby

[57] ABSTRACT

According to the present invention, a D/A converter control method for an IC test apparatus is provided comprising the steps of: identifying a D/A converter in an IC test apparatus possessing a plurality of D/A converters with different axes of rotation of gain adjustment; and conducting a gain adjustment corresponding to the aforementioned identified D/A converter.

12 Claims, 2 Drawing Sheets

D/A CONVERTER CONTROL METHOD FOR IC TEST APPARATUS

BACKGROUND OF THE INVENTION

1. Field of the Invention

The present invention relates to a D/A converter control method for use in supplying a required voltage level for device measurement in an IC test apparatus. More concretely, with regard to an IC test apparatus possessing a plurality of D/A converters with different axes of rotation of gain adjustment, the present invention relates to a D/A converter control method for an IC test apparatus wherein a D/A converter is identified and the gain adjustment corresponding to this identified D/A converter is performed.

2. Background Art

Conventionally, this type of D/A converter control method for an IC test apparatus has been conducted by means of performing offset adjustment and gain adjustment via auto-calibration with regard to a single type of D/A converter. However, certain drawbacks exist such as during times of production cessation of the aforementioned D/A converter, then the mounted print substrate must be reconstructed.

In addition, when changing to another type of D/A converter, transposition of the former product is not possible if the axis of rotation of gain adjustment is different. As a result, it is necessary to change and adjust the structural components such that (1) a new print substrate cannot be mounted onto the IC test apparatus onto which the former print substrate is mounted, and (2) a former print substrate cannot be mounted onto the IC test apparatus onto which a new print substrate is mounted.

Furthermore, when a specific D/A converter is changed to another D/A converter with a different axis of rotation of gain adjustment, problems arise such as loss of transposition capability with the loaded IC test apparatus, in addition to maintenance difficulties thereof, because of performing offset adjustment and gain adjustment via auto-calibration according to the conventional technology.

SUMMARY OF THE INVENTION

It is an object of the present invention to provide a D/A converter control method of an IC test apparatus in which an IC test apparatus comprising a plurality of D/A converters with different axes of rotation of gain adjustment can be employed.

In order to achieve the aforementioned object, the present invention provides a D/A converter control method of an IC test apparatus comprising the steps of: identifying a D/A converter in an IC test apparatus possessing a plurality of D/A converters with different axes of rotation of gain adjustment; and conducting a gain adjustment corresponding to said identified D/A converter.

According to the method of the present invention, it is possible to use even an IC test apparatus comprising a plurality of D/A converters with different axes of rotation of gain adjustment.

DETAILED DESCRIPTION OF THE PREFERRED EMBODIMENTS

According to the D/A converter control method of an IC test apparatus of the present invention, the output of a D/A converter is set to zero before commencing offset adjustment, the output voltage thereof is then measured, a maximum value for a D/A converter is set, and a maximum value from a variable range of gain adjustments is sent to a D/A converter. The output of a D/A converter is then reset to zero, the output voltage thereof is measured, and the difference between the previously measured voltage and the currently measured voltage is calculated.

In the case when this calculated difference is less than a gain error of electrical specification of a certain D/A converter, then said D/A converter is determined to be said certain D/A converter. In contrast, in the case when this calculated difference is greater than a gain error of electrical specification of a certain D/A converter, then said D/A converter is determined to be a different D/A converter, and the gain adjustment for each respective D/A converter is performed.

Figure 1:
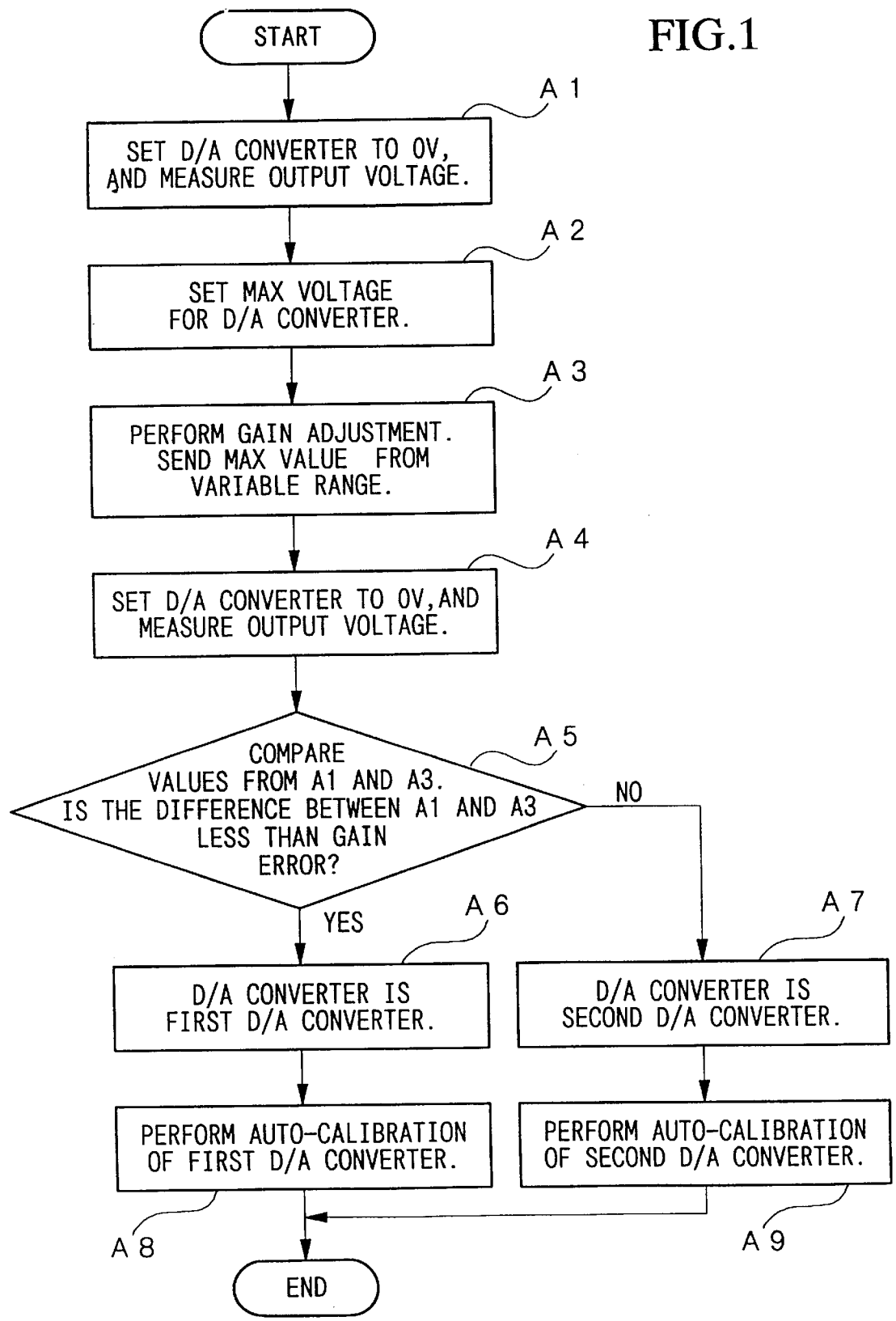
FIG. 1 is a flow chart showing a procedural sequence of a D/A converter control method of an IC test apparatus according to a first preferred embodiment of the present invention.

In the following, the D/A converter control method of an IC test apparatus according to a first preferred embodiment of the present invention will be explained with reference to FIGS. 1–3. D/A converters applicable to this first preferred embodiment include, for example, first and second D/A converters each with a different axis of rotation of gain adjustment.

Figure 2:
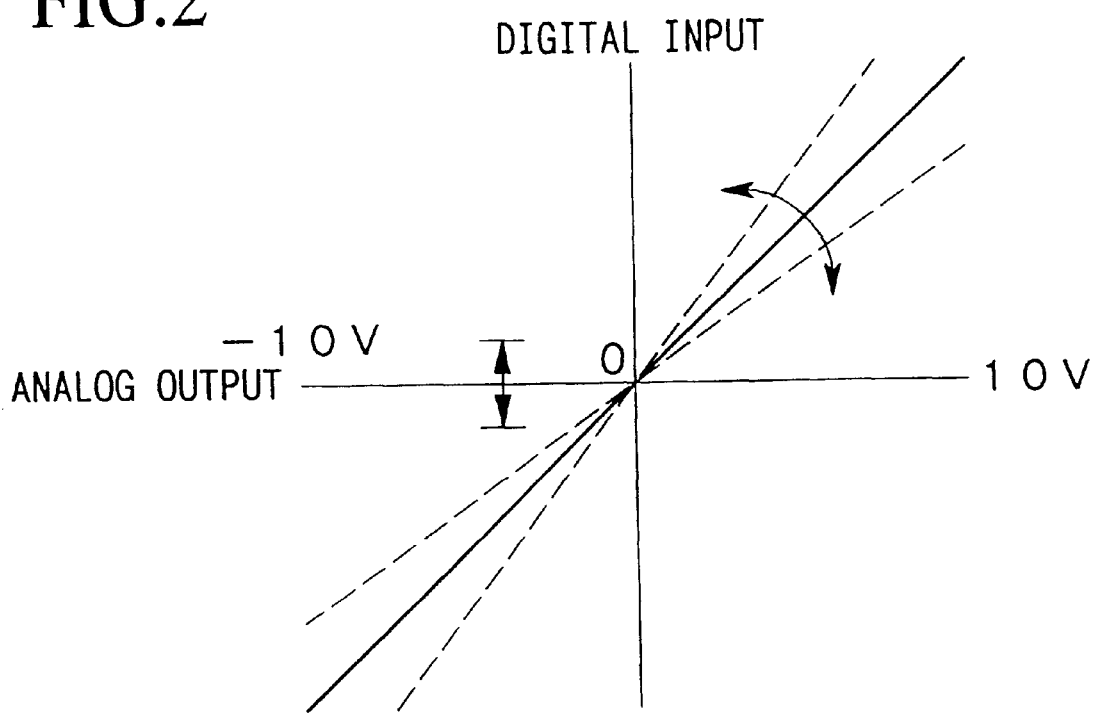
FIG. 2 is a diagram for use in explaining the relationship between a gain adjustment and offset adjustment of a certain D/A converter.
Figure 3:
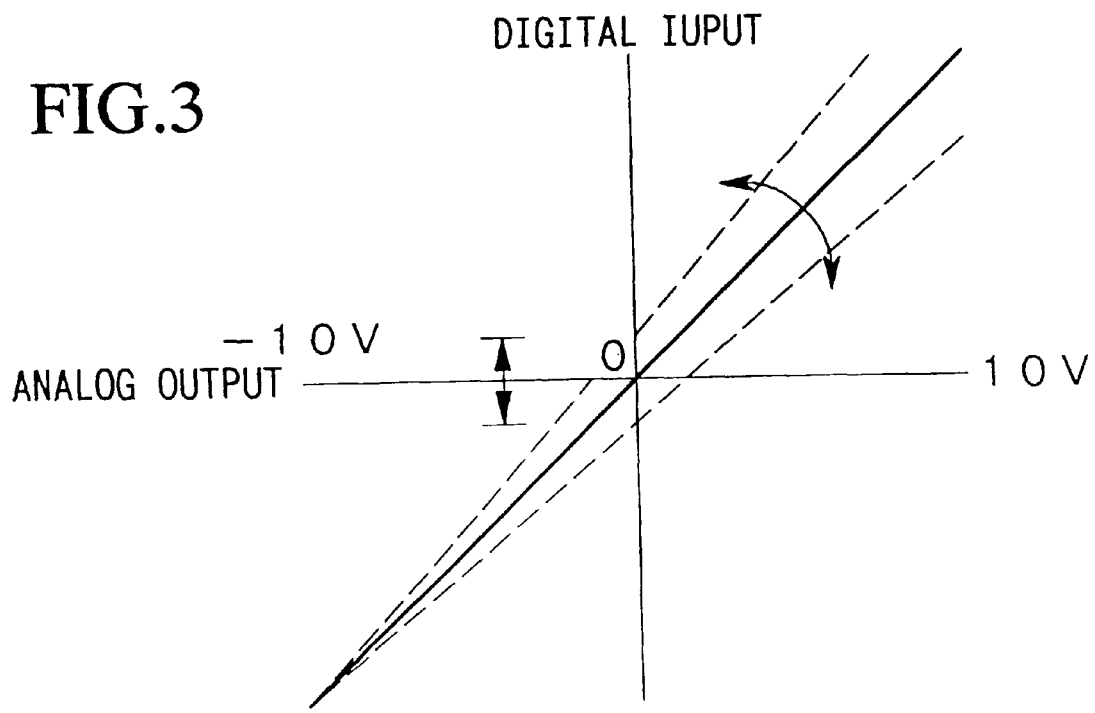
FIG. 3 is a diagram for use in explaining the relationship between a gain adjustment and offset adjustment of another D/A converter.

FIG. 2 shows the relationship between a gain adjustment and offset adjustment of a first D/A converter; while FIG. 3 shows the relationship between a gain adjustment and offset adjustment of a second D/A converter. Both FIGS. 2 and 3 comprise a vertical axis representing digital input and a horizontal axis representing analog output.

Among these first and second D/A converters, the first D/A converter has an axis of rotation of gain adjustment centered at zero volts with a corresponding line rotation as shown in FIG. 2. The offset adjustment line moves up and down, while still centered at zero volts.

The second D/A converter has an axis of rotation of gain adjustment centered at −10 volts with a corresponding line rotation as shown in FIG. 3. The line corresponding to the offset adjustment moves up and down, while a center at −10 volts.

In the following, the D/A converter control method of an IC test apparatus according to a first preferred embodiment of the present invention will be explained with reference to the flow chart shown in FIG. 1. In step A1 of the flow chart shown in FIG. 1, before commencing gain or offset adjustment, the D/A converter is set to zero, and the output voltage thereof is then measured. Subsequently, in step A2, a maximum value for a D/A converter is set.

In step A3, gain adjustment of the D/A converter is performed, and a maximum value from a variable range of gain adjustments is sent to this D/A converter. In step A4, the D/A converter is then reset to zero, and the output voltage thereof is measured.

Subsequently, in step A5, the previously measured output voltage value in step A1 and the currently measured output voltage value in step A4 are compared, and the difference between the two values is calculated. In the case when this calculated difference is less than a gain error of electrical specification of a first D/A converter, then the aforementioned D/A converter is determined to be said first D/A converter in step A6.

In addition, in step 7, when this calculated difference is greater than the aforementioned gain error, then said D/A converter is determined to be said second D/A converter.

In the case of FIG. 2, even when conducting gain adjustment at the maximum voltage of the D/A converter, the point at zero volts barely moves. On the other hand, in the case of FIG. 3, when conducting gain adjustment at the maximum voltage of the D/A converter, the point at zero volts slides as shown therein. Accordingly, the gain adjustment for each respective D/A converter is performed.

In other words, in the case when the D/A converter in question is determined to be said first D/A converter in step A6, then auto-calibration of this first D/A converter is performed in step A8. In the same manner, when the D/A converter in question is determined to be said second D/A converter in step A7, then auto-calibration of this second D/A converter is performed in step A9.

I claim:

1. A D/A converter control method for an IC test apparatus comprising the steps of:
   identifying a type of D/A converter in an IC test apparatus having a plurality of D/A converters with different axes of rotation of gain adjustment; and
   conducting a gain adjustment corresponding to said identified type of the D/A converter.

2. A D/A converter control method for an IC test apparatus according to claim 1 wherein said step of identifying comprises:
   setting an output of a D/A converter to a standard value and measuring the output voltage thereof;
   setting a maximum value for a D/A converter;
   sending a maximum value from a variable range of gain adjustments to said D/A converter;
   resetting an output of said D/A converter to a standard value and measuring the output voltage thereof;
   calculating the difference between said previously measured voltage and said currently measured voltage; and
   determining a type of said D/A converter based on whether or not said calculated difference of said D/A converter is less than a predetermined value of a certain D/A converter.

3. A D/A converter control method for an IC test apparatus according to claim 2, wherein said standard value for said output voltage of said D/A converter is "0".

4. A D/A converter control method for an IC test apparatus according to claim 2, wherein said predetermined value is a gain error of electrical specification of a certain D/A converter of the IC test apparatus.

5. A D/A converter control method for an IC test apparatus according to claim 1, wherein said gain adjustment corresponding to said identified D/A converter is performed by means of auto-calibration in response to said identified D/A converter.

6. A D/A converter control method for an IC test apparatus according to claim 1, wherein one D/A converter among said plurality of D/A converters has an axis of rotation of gain adjustment equal to 0 volts.

7. A D/A converter control method for an IC test apparatus according to claim 1, wherein said plurality of D/A converters comprises:
   a D/A converter having an axis of rotation of gain adjustment which equals 0 volts; and
   a D/A converter having an axis of rotation of gain adjustment of a value other than 0 volts.

8. A D/A converter control method for an IC test apparatus having a plurality of D/A converters with different axes of rotation of gain adjustment comprising the steps of:
   setting an output of a D/A converter to a standard value and measuring the output voltage thereof;
   setting a maximum value for a D/A converter;
   sending a maximum value from a variable range of gain adjustments to a D/A converter;
   resetting an output of a D/A converter to a standard value, and measuring the output voltage thereof;
   calculating the difference between said previously measured voltage and said currently measured voltage;
   identifying a type of D/A converter based on whether or not said calculated difference of said D/A converter is less than a predetermined value of a certain D/A converter; and
   performing a gain adjustment of said D/A converter by means of auto-calibration in response to the identified type of the D/A converter.

9. A D/A converter control method for an IC test apparatus according to claim 8, wherein said standard value for said output of said D/A converter is "0".

10. A D/A converter control method for an IC test apparatus according to claim 8, wherein said predetermined value is a gain error of electrical specification of a certain D/A converter of the IC test apparatus.

11. A D/A converter control method for an IC test apparatus according to claim 8, wherein one D/A converter of said plurality of D/A converters has an axis of rotation of gain adjustment equal to 0 volts.

12. A D/A converter control method for an IC test apparatus according to claim 8, wherein said plurality of D/A converters comprises:
   a D/A converter having an axis of rotation of gain adjustment which equals 0 volts; and
   a D/A converter having an axis of rotation of gain adjustment is a value other than 0 volts.

* * * * *